United States Patent [19]

Mogi et al.

[11] 4,439,787
[45] Mar. 27, 1984

[54] AFT CIRCUIT

[75] Inventors: Takao Mogi, Tokyo; Kouji Morita, Kodaira; Osamu Matsunaga, Tokyo, all of Japan

[73] Assignee: Sony Corporation, Tokyo, Japan

[21] Appl. No.: 349,651

[22] Filed: Feb. 17, 1982

[30] Foreign Application Priority Data

Feb. 19, 1981 [JP] Japan .................................. 56-22534
Feb. 20, 1981 [JP] Japan .................................. 56-24539

[51] Int. Cl.³ .............................................. H04N 5/50
[52] U.S. Cl. ................................ 358/195.1; 455/169; 455/195; 455/264
[58] Field of Search .................... 358/195.1; 455/164, 455/169, 182, 192, 195, 262–264

[56] References Cited

U.S. PATENT DOCUMENTS 4,025,953  5/1977  Sideris ............................. 358/195.1
4,118,740 10/1978  Rypkema ....................... 358/195.1

Primary Examiner—Richard Murray
Attorney, Agent, or Firm—Lewis H. Eslinger; Alvin Sinderbrand

[57] ABSTRACT

An AFT circuit for a television receiver automatically adjusts the frequency of a tuner local oscillator, not only on the basis of an error signal provided from an AFT discriminator, but also on the basis of horizontal synchronizing pulses contained in the video signal to which the receiver is tuned. A synch signal detector detects the presence or absence of the synchronizing pulses. A control circuit provides a control signal to the local oscillator in response to the AFT error signal when the latter is above or below a reference voltage such that the desired frequency is within an AFT capture range. However, when the AFT signal is at the reference voltage, the control circuit provides the control signal based on the presence or absence of the synchronizing pulses, such that when the pulses are present, the local oscillator frequency is raised, but when the pulses are absent, the local oscillator frequency is lowered. Then, when the AFT signal is present, the local oscillator is controlled thereby. This AFT circuit has an expanded effective capture range, and is prevented from locking onto the sound carrier of an adjacent channel.

17 Claims, 10 Drawing Figures

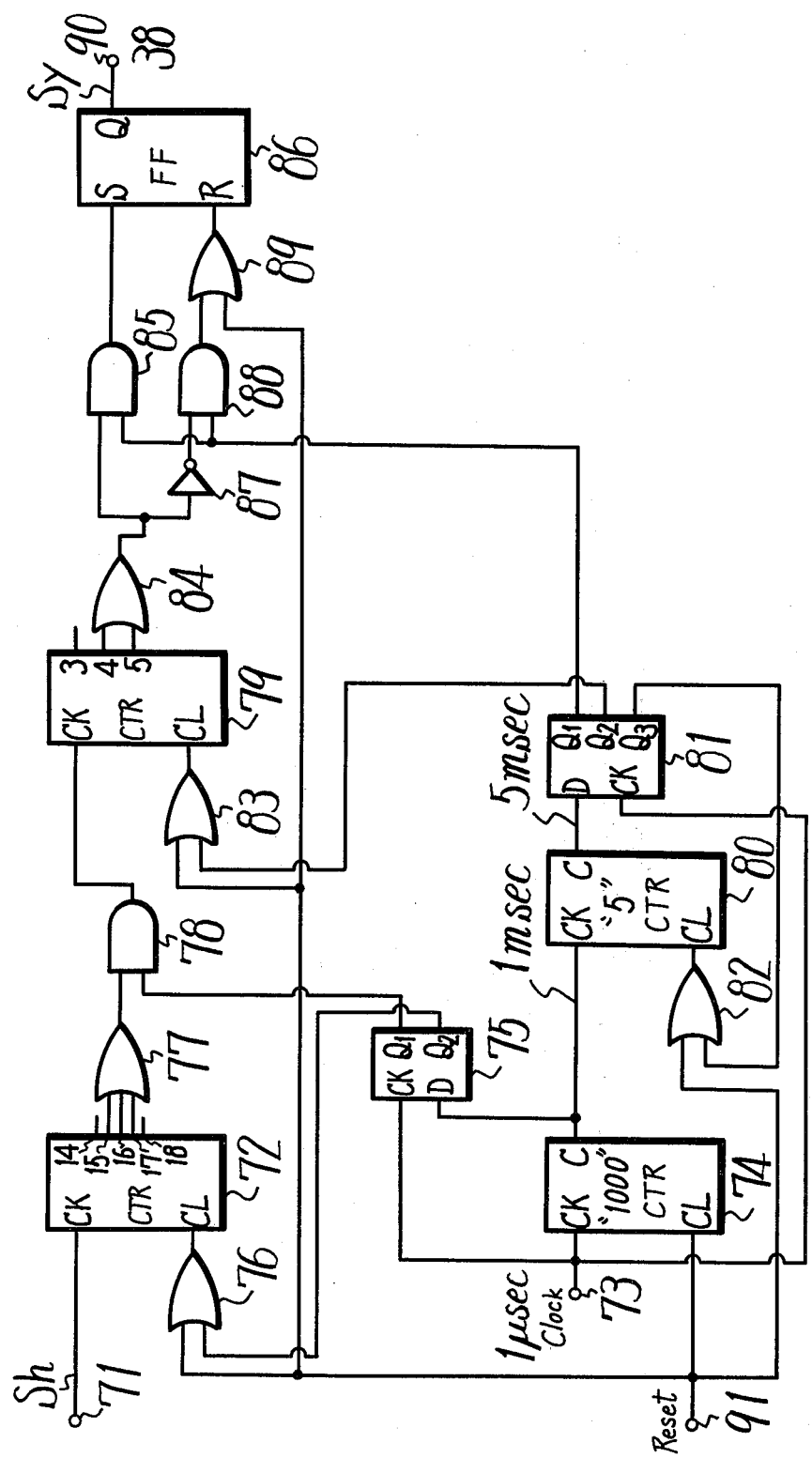
F I G. 7

AFT CIRCUIT 00202

BACKGROUND OF THE INVENTION

1. Field of the Invention

This invention relates to an automatic fine tuning (AFT) circuit suitable for controlling the local oscillator frequency in the tuner of a color television receiver, and is particularly directed to such an AFT circuit having an expanded capture range for finely tuning to broadcast-frequency video signal.

2. Description of the Prior Art

Because fine tuning of a color television receiver is important in achieving proper color balance in a color television picture, most color television receivers incorporate an automatic fine tuning (AFT) section so that the receiver will tune itself. The AFT section tunes the local oscillator of the tuner to a frequency corresponding to an exact tuned position with respect to the band pass characteristic of the receiver's intermediate-frequency (IF) stage. With such an AFT circuit, the picture and sound remain correctly tuned despite any signal drift or tuning misadjustment.

Generally, AFT circuits include an error sensor and a control device. The error sensor can be a discriminator tuned to the video IF carrier frequency (typically 45.75 MHz) and providing a DC error voltage corresponding to the deviation of the video IF signal about or below that frequency, within a capture range of above ±1.2 MHz. The control device can typically be a voltage-controlled oscillator associated with the local oscillator to shift the local oscillator frequency in accordance with the DC error voltage.

When a video signal is generated from a video tape recorder (VTR), video disc player, video game, home computer, or other device and is to be monitored on a color television receiver, the video signal is typically modulated onto a broadcast-frequency carrier signal, so that the generated video signal can be applied to the tuner of the receiver. This is usually done on an RF modulator incorporated in the device.

For example, in the New York City viewing area, broadcast channels 2, 4, 5, 7, 9, 11, and 13 are assigned to different VHF television broadcast stations, with the intervening channels, i.e., channels 3, 6, 8, 10, and 12 not being assigned so as to minimize the chance of adjacent-channel interference. Accordingly, the generated video signal can be modulated onto the broadcast frequency corresponding to one of these unassigned channels, e.g., channel 3.

On receiving the video signal modulated onto the frequency of channel 3, the signals of adjacent channel 2 and 4 are attenuated and the modulated channel 3 signal is received and processed in the receiver.

However, if this unassigned channel 3 is selected by the receiver's channel selector, but the RF modulator of the VTR or other device is not operating, the AFT circuit will hunt for the center frequency of the sound signal for the next-lower adjacent channel, i.e., channel 2. If that frequency is within the AFT capture range, the sound carrier frequency of channel 2 will be pulled in by the AFT circuit.

Therefore, once this has happened, if the RF modulator commences operation, the broadcast-frequency video signal produced thereby (i.e., channel 3) will be above the capture range of the AFT circuit which is tuned to the channel 2 sound carrier. Thus, it can occur that the receiver will appear unable to receive the broadcast-frequency video signal from the VTR or other device.

When the foregoing occurs, the user might surmise that either the receiver or the VTR is out of order, although the problem can usually be cleared by re-selecting the desired channel (in this case, channel 3).

The above-described AFT misoperation can also occur where the television receiver is connected to a cable system in which every channel is used and, for some reason, the signal on one channel is interrupted.

In order to prevent this misoperation from occurring, it is possible to reduce the AFT capture range. However, an AFT circuit with a narrow capture range will not operate reliably if there is an unusual amount of tuner drift, for example, due to temperature changes, and will not pull in a video cable signal where the carrier frequency is offset somewhat from the standard television broadcast frequencies.

OBJECTS AND SUMMARY OF THE INVENTION

Accordingly, it is an object of this invention to provide an AFT circuit free of the defects of the prior art.

It is a more specific object of this invention to provide an AFT circuit having a capture range that is wide enough to pull in a desired video signal when a large signal drift is to be accommodated, but becomes sufficiently narrow, once the desired video signal is tuned, to preclude the AFT circuit from pulling in an adjacent-channel signal.

A further object of this invention is to provide an AFT circuit utilizing a synchronizing signal detecting circuit, and automatically fine-tuning to a video signal containing a synchronizing signal on the basis of the detected synchronizing signal.

A still further object of this invention is to provide an AFT circuit establishing a waiting mode when an AFT voltage, provided from the AFT discriminator, returns to a reference level at a time that the synchronizing signals are not detected.

According to an aspect of this invention, an AFT circuit is arranged for controlling the local oscillator frequency of a tuning stage in a television receiver such that when the AFT voltage is present, i.e., is different from a predetermined reference level, while synchronizing signals are detected to be present, automatic fine tuning is carried out on the basis of the AFT voltage. However, when this AFT voltage is not present, i.e., remains at the reference level, the local oscillator frequency is increased if the synchronizing signals are detected but is decreased if the synchronizing signals are not detected.

An automatic fine tuning circuit embodying this invention controls a heterodyne tuning stage of a television receiver in which a local oscillator generates a local oscillator signal at a tunable local oscillator frequency to be mixed with a broadcast-frequency video signal to which the receiver is to be tuned to produce a video IF signal constituted by a video information signal carried on a video IF carrier having a video IF frequency. A frequency discriminator supplied with the video IF signal has an output providing an AFT error signal representing any departure of the video IF frequency from a predetermined frequency and which is present (i.e., above or below a reference level) when the video IF frequency is within a predetermined AFT capture range. A synchronizing signal detector detects the existence of a synchronizing signal, such as the horizontal synch pulses, normally occurring in the video information signal, and provides a detecting signal indicative of the presence of such synchronizing signal. A control circuit provides a control signal to the local oscillator in response to the AFT signal and to the detecting signal. The control signal is provided in response to the AFT signal when the AFT signal has a value indicating that the video IF signal is within the capture range. However, when the AFT signal vanishes, or otherwise indicates that the video IF signal is outside the capture range, the control signal is provided in response to the detecting signal. That is, when the synchronizing signal is detected to be present, the local oscillator frequency is increased, but when the synchronizing signal is not detected to be present, the local oscillator frequency is decreased.

Alternatively, if the tuner is microprocessor based so that automatic fine tuning is carried out by means of a software program, the local oscillator frequency is reduced if the synchronizing signal is not detected but is increased if the synchronizing signal is detected. Then, if the AFT signal is present so that its value indicates that the video IF signal is within the capture range, the local oscillator frequency is increased or decreased until the AFT signal indicates that the video IF signal is at the desired frequency.

If the synchronizing signals are not detected at this time, the AFT circuit has tuned the local oscillator to the carrier frequency of a lower-channel sound signal. Thus, if no synchronizing signals are detected, the local oscillator frequency is raised until the AFT signal again indicates that the video IF signal is within the capture range, and then the local oscillator frequency is finely adjusted on the basis of the AFT signal.

A delay circuit can be included so that, in the event of momentary video signal interruption, the AFT circuit will not change the local oscillator frequency away from the desired frequency.

The above and many other objects, features, and advantages of this invention will become apparent from the following description of a preferred embodiment of the invention, when considered in connection with the accompanying drawings.

BRIEF DESCRIPTION OF THE DRAWINGS

FIGS. 6 and 7 are schematic diagrams of respective portions of the AFT circuit of FIG. 5.

DETAILED DESCRIPTION OF A PREFERRED EMBODIMENT

Figure 1:
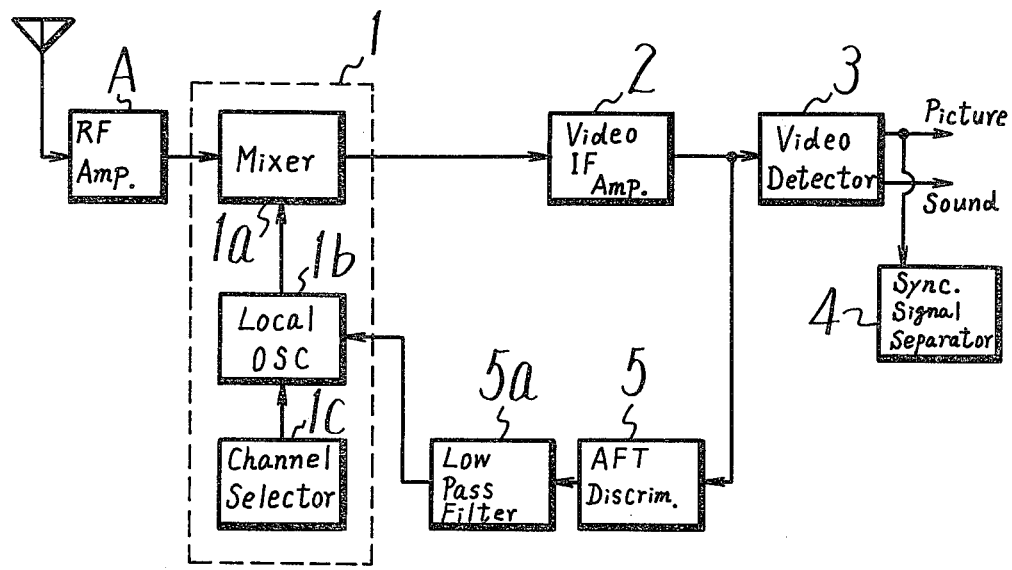
FIG. 1 is a schematic block diagram of an AFT circuit according to the prior art.

With reference to the drawings, FIG. 1 shows a typical arrangement of a conventional AFT circuit often incorporated into a color television receiver.

In the receiver, a video signal is provided from an RF amplifier A to a heterodyne video tuner 1. In the latter, a mixer 1a provides a video IF signal as the difference signal resulting from the broadcast-frequency video signal from the RF amplifier A and a local oscillator signal provided from a local oscillator 1b. A channel selector 1c generally determines the local oscillator frequency.

The video IF signal is then provided from the tuner 1 through a video IF amplifier 2 to a video detector 3 which provides demodulated television and sound signals. A synchronizing signal separator 4 can derive the horizontal synchronizing pulses from the television picture signal, and thereby control the horizontal scanning of a CRT or other display device (not shown).

The video IF signal is also provided to an AFT discriminator 5 which generates a DC error voltage, or AFT signal, whose value depends on the amount and direction of frequency error between the video IF signal frequency and a reference frequency, at least within a range, i.e., a pull-in or capture range, of the predetermined frequency. The AFT signal is then provided through a low pass filter 5a to the local oscillator 1b to adjust the frequency thereof in the sense to minimize the AFT signal.

In order to best understand the advantages of this invention over the above-described prior art AFT circuit, the nature of standard broadcast-frequency and intermediate frequency video signals will be briefly explained.

Figure 2:
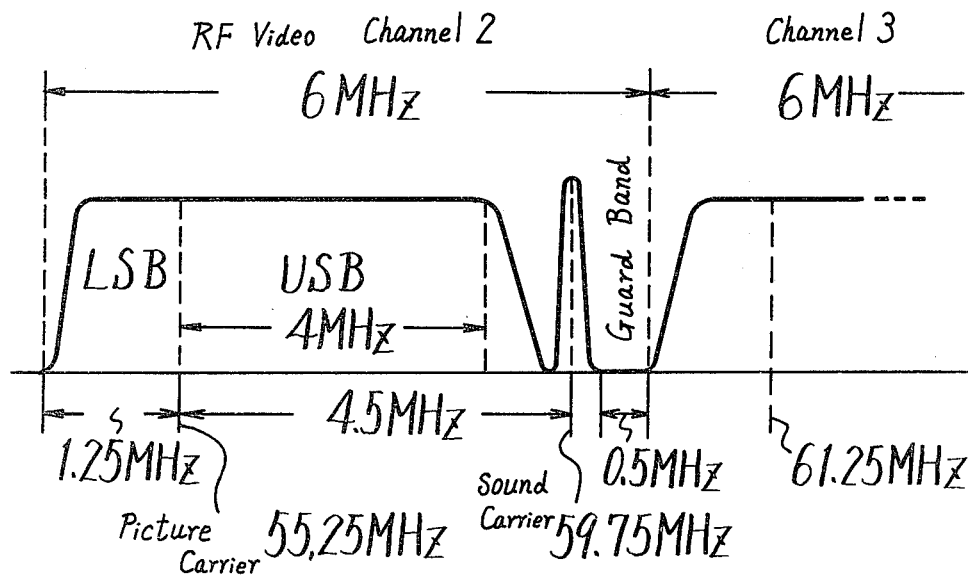
FIG. 2 is a chart of a broadcast-frequency video signal.

As shown in FIG. 2, a broadcast frequency video signal, for example, as transmitted by a television broadcast station, extends over a bandwidth of 6 MHz, including a video, or picture portion having a lower side band extending 1.25 MHz below a picture carrier, and an upper side band having a flat portion extending 4 MHz above the picture carrier. The audio, or sound portion of the television signal is an FM signal having a swing of 25 KHz above and below a sound carrier disposed 4.5 MHz above the picture carrier. A guard band of 0.5 MHz separates the sound signal from the video signal of the next higher channel.

In the television broadcast system used in North America, there are twelve VHF channels numbered 2 through 13 and seventy UHF channels numbered 14 to 83, each having a 6 MHz bandwidth.

Channel 2 is illustrated in FIG. 2 as a typical such channel, and is shown with a portion of the next channel thereabove, to wit, channel 3. Channel 2 has a picture carrier frequency of 55.25 MHz and a sound carrier frequency of 59.75 MHz. The adjacent channel 3 has a picture carrier frequency of 61.25 MHz and a sound carrier frequency of 65.75 MHz.

With the exception of only channels 2 and 14, which are at the bottom of respective television broadcast frequency bands, the picture carrier for each channel is separated from the sound carrier for the next channel therebeneath by only 1.50 MHz.

Therefore, station frequencies are assigned such that, wherever possible, adjacent channels are not assigned to stations in the same geographical area. For example, as mentioned previously, channel 2 and 4 are assigned to stations in the New York area, while channel 3 is unassigned. However, it is common to modulate a video signal, for example, from the output of a VTR, video disc player, video game, home computer, or other video device, on an unassigned channel, such as channel 3, so that the video signal can be reproduced and monitored on a television receiver.

Figure 3A:
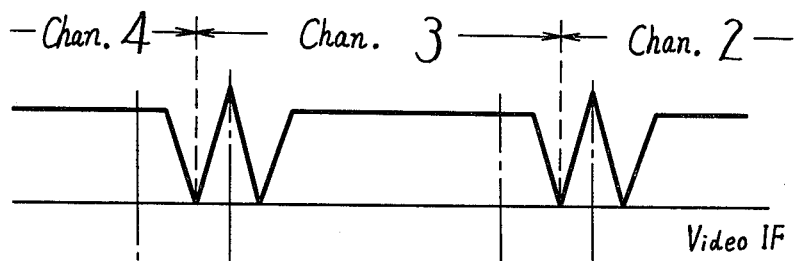
FIGS. 3A and 3B are frequency characteristic charts of a video IF signal and an AFT discriminator, respectively.

In order to tune the video receiver to the desired channel, in this case channel 3, the channel selector 1c causes the local oscillator 1b to generate a local oscillator frequency of 107.0 MHz. Because the local oscillator frequency is higher than the broadcast channel frequencies, for each channel the sound and picture portions are transitioned, as shown in FIG. 3A. That is, whereas the sound carrier in the broadcast television signal is higher than the picture carrier thereof, in the video IF signal shown in FIG. 3A, a corresponding sound carrier $f_s$ (41.25 MHz) is disposed 4.5 MHz below an associated picture carrier $f_p$ (45.75 MHz). Also, because a higher-frequency local oscillator signal is used, the video IF signal corresponding to the next lower channel (i.e., channel 2) will have a sound carrier $f'_s$ at 47.25 MHz, which is 1.5 MHz above the video IF picture carrier frequency $f_p$. Likewise, the sound carrier $f_s$ of the video IF signal is separated by only 1.5 MHz from the picture carrier $f'_p$ (39.75 MHz) of the next channel thereabove (i.e., channel 4).

Figure 3B:
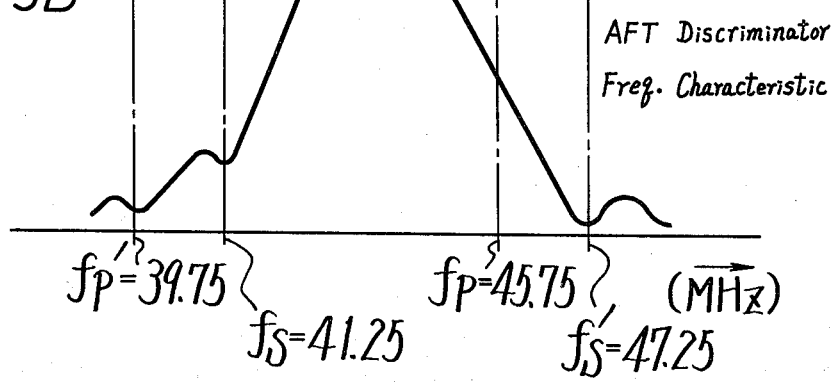

Ideally, the local oscillator frequency should be exactly 45.75 MHz above the picture carrier frequency of the broadcast frequency video signal to be tuned by the local oscillator. Any deviation above or below that frequency will result in a corresponding deviation in the video IF signal by the same amount. Therefore, the transfer characteristic of the video IF amplifier 2, shown illustratively in FIG. 3B, will cause sharp attenuation of the video IF signal if the local oscillator frequency is too low, but will, at the same time, pass the low and intermediate frequencies thereof without significant attenuation. On the other hand, if the local oscillator frequency is too high, for example, by only about 1 MHz, the picture carrier and the low and intermediate frequency components of the video signal carried on the video IF signal are attenuated.

Accordingly, as the horizontal synchronizing signal occurs in a lower-frequency portion of the video signal, the same can be reproduced when the local oscillator frequency is several MHz below the ideal local oscillator frequency (i.e., 107.0 MHz) but will vanish altogether if the local oscillator frequency is only slightly above the ideal local oscillator frequency.

Figure 4A:
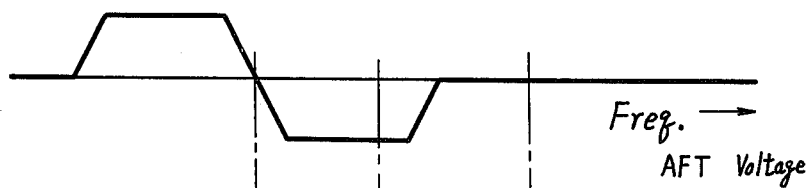
FIGS. 4A and 4B are charts showing the AFT signal as a function of video IF signal frequency.
Figure 4B:
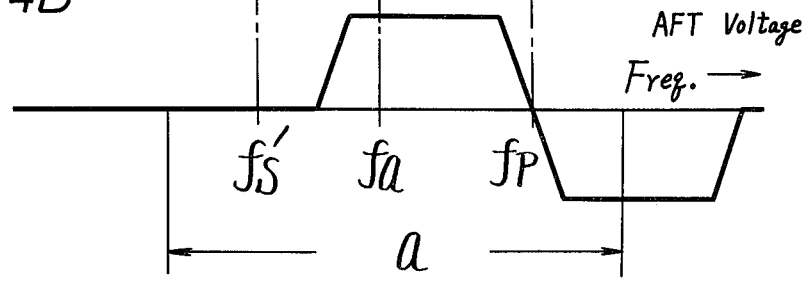

The AFT voltage provided from the AFT discriminator 5 varies above and below a reference level, as shown in FIGS. 4A and 4B, within a predetermined capture range of about ±1.2 MHz, to show the direction and amount of deviation of the video IF signal from a predetermined reference frequency (usually 46.1 MHz).

Normally, where a strong video signal is present, and the local oscillator frequency is selected so that the tuner is tuned to a frequency $f_a$ below the picture carrier $f_p$ but within the capture range of the AFT discriminator 2, the local oscillator frequency will be automatically adjusted until the tuner is tuned to the picture carrier frequency $f_p$ as shown in FIG. 4B. However, if the video signal for the tuned-in channel is, for some reason, not present, and the frequency $f_a$ to which the tuner 1 is tuned is within the capture range of the sound carrier $f'_s$ for the next lower channel, as shown in FIG. 4A, the local oscillator frequency will be lowered so as to tune to the adjacent-channel sound carrier $f'_s$. Nevertheless, because the frequency $f_p$ is above the sound carrier frequency $f'_s$ by more than the capture range, when the video signal on the desired channel reappears, the AFT circuit will not able to change the local oscillator frequency to tune the tuner 1 to the picture carrier frequency $f_p$. Consequently, if the RF modulator of a VTR or other device momentarily interrupts its output signal, it is possible that the television receiver associated therewith can appear to misoperate.

Frequently, as mentioned above, the horizontal synchronizing signal contained in the video information in the video IF signal can be detected over an extended portion of the channel bandwidth. The extent that the local oscillator frequency can be accurately changed based on the detected presence (or absence) of the synchronizing signal is indicated by the two-headed arrow a in FIG. 4B. AFT operation based on detection of the horizontal synchronizing signal can be carried out even when the AFT circuit has tuned the local oscillator frequency to the sound carrier $f'_s$ of the next-lower channel.

Accordingly, the AFT circuit according to this invention is sensitive to both the AFT error signal from the AFT discriminator 5 and also to the presence of horizontal synchronizing signals from the synchronizing signal separator 4 in order to extend the capture range for AFT operation.

Figure 5:
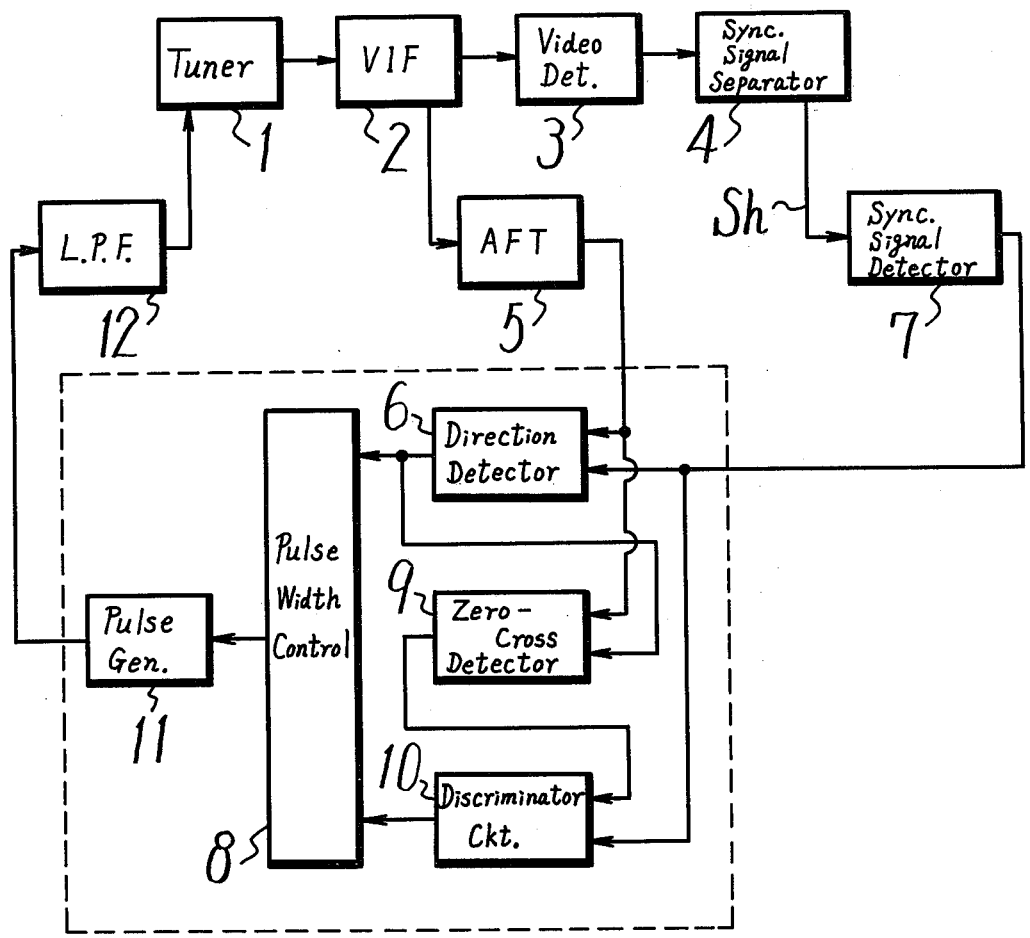
FIG. 5 is a schematic block diagram of an AFT circuit embodying this invention.

A basic diagram of an AFT circuit embodying this invention is shown in FIG. 5. Elements shown therein that are also common to the prior art circuit of FIG. 1 are identified with the same reference characters, and a description thereof will not be repeated.

In the AFT circuit of FIG. 5, an AFT signal is provided from the AFT discriminator 5 to an input of a direction detector 6. The synch signal separator 4 provides the horizontal synchronizing signal $S_h$ to a synch signal detector 7. The latter provides to another input of the direction detector 6 a detecting signal $S_y$ which is high when the synchronizing signal $S_h$ is present, but which is low otherwise.

The direction detector 6 provides a direction signal to a pulse width control circuit 8, the direction signal being high to correspond to a required increase in local oscillator frequency, but low when a lower local oscillator frequency is required. If an AFT signal (different from a reference level) is not provided from the AFT discriminator 5, the direction signal generated by the direction detector 10 will be high if the detector signal from the synch signal detector 7 is high, but will be low if that signal is low. The direction signal from the detector 6, and the AFT signal are provided to respective inputs of a zero-cross detector 9 which provides a signal when the sense of the AFT signal changes from above to below its reference level, or from below that reference level to above it. The output of the zero-cross detector 9 is coupled to an input of a discriminating circuit, another input of which is coupled to receive the detecting signal from the synchronizing signal detector 7. The discriminating circuit 10 provides to another input of the pulse width control circuit 8 a discriminating signal in response to the occurrence of the zero-cross signal whenever the synchronizing signal is detected to be present.

In response to the direction signal and the discriminating signal, the pulse width control circuit 8 controls the width of pulses in a pulse train generated by a pulse generator 11. The output of this generator 11 is thus provided as a pulse-width modulated signal to a low-pass filter 12, which converts that signal to a DC control signal to be applied to the local oscillator of the tuner 1.

The discriminating circuit 10 discriminates the end of an automatic fine tuning operation. That is, at the time when the zero-cross detector indicates that the AFT voltage from the AFT discriminator 5 has crossed the reference level, if the detecting signal from the synch signal detector 7 is high, the discriminating signal from the discriminating circuit 10 indicates that the AFT operation should be interrupted, and that the pulse width control circuit 8 should commence a waiting mode.

With the AFT circuit arranged as shown in FIG. 5, when the AFT voltage from the AFT discriminator 5 is present, that is, has a value indicating that it is within the capture range as shown in FIG. 4B, the local oscillator of the tuner 1 is controlled in response to this AFT voltage. Then, after the AFT voltage reaches the zero-cross point, corresponding to the frequency $f_p$ in FIG. 4B, if the detecting signal from the synch signal detector 7 is high, the AFT operation is judged to be complete, and the television receiver undergoes normal receiver operation thereafter. However, in the event that the synchronizing signal $S_h$ is not present, and the detecting signal $S_y$ from the synch signal detector 7 is low, the tuner 1 is judged to be pulled in to the sound carrier frequency $f_s'$ of the lower adjacent channel. At that time, the automatic fine tuning operation is interrupted and the pulse width control circuit 8 is set into its waiting mode. Then the local oscillator frequency can be raised toward that associated with the picture carrier of the desired channel.

With the circuit of this invention, if the RF modulator of the VTR or other device is not operated when the channel devoted for use with that device, in this example channel 3, is selected by the channel selector of the television receiver, the received signal is pulled in or captured by the adjacent channel sound carrier frequency $f_s'$. Then, because there are no horizontal synchronizing signals in the sound signal, the automatic fine tuning operation is interrupted and the pulse width control circuit 8 is set into its waiting mode. After the RF modulator commences operation the synchronizing signal $S_h$ can be detected by the synch signal detector 7, even though the picture carrier $f_p$ of the desired channel (channel 3) is still outside the AFT capture range. In response to reception of the synchronizing signals $S_h$, the pulse width control circuit 8 increases the pulse width of the pulse train produced by the pulse generator 11, and thereby raises the local oscillator frequency of the tuner 1. This brings the video IF signal to within the capture range of the picture carrier $f_p$. Then, the video signal from the RF modulator is pulled into the picture carrier frequency $f_p$ by the AFT circuit and the local oscillator frequency is maintained at the proper frequency.

Thus, with the AFT circuit of this invention such as is illustrated in FIG. 5, misoperation characteristic of the prior art is avoided.

Figure 6:
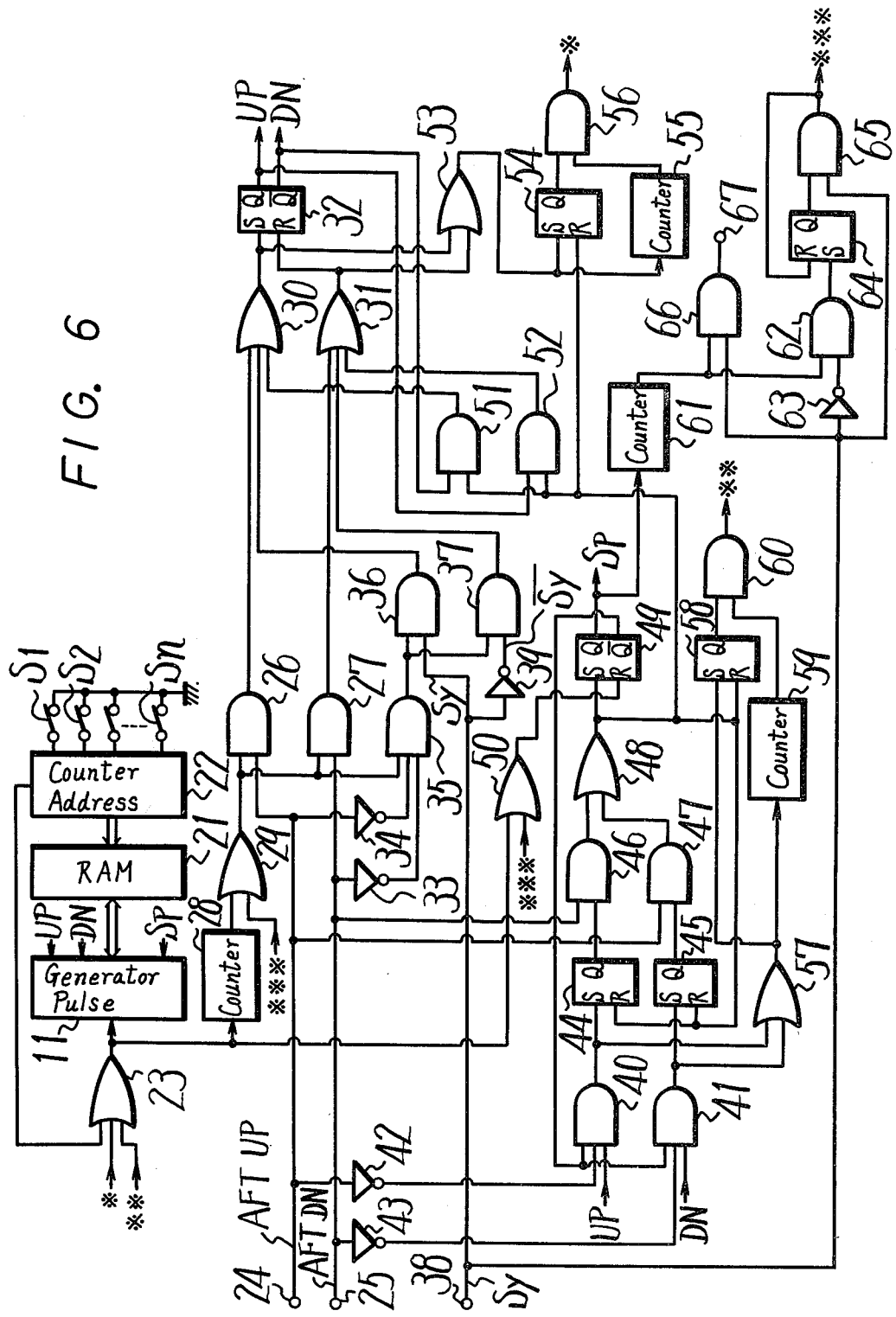

One possible embodiment of a portion of the FIG. 5 AFT circuit (encompased by a broken line) is shown in detail as logic circuitry in FIG. 6.

In FIG. 6, a random-access memory (RAM) 21 for storing channel code signals corresponding to local oscillator frequencies for various channels is coupled to the pulse signal generator 11, and address terminals of the RAM 21 are connected to an address counter 22, whose counter inputs are connected to respective selecting switches $S_1, S_2, \ldots S_n$. The addresses stored in the RAM 21 correspond to the particular switches $S_1$–$S_n$ selected by a viewer.

A signal indicating a channel change is supplied from the address counter 22 through an OR circuit 23 as a data-set signal to a data-set terminal of the pulse generator 11.

Another signal indicating that the AFT voltage is higher than a predetermined reference level (AFT UP) and a signal indicating that the AFT voltage is lower than the reference level (AFT DN) are supplied to respective input terminals 24 and 25 and are supplied therefrom to respective AND gates 26 and 27. The data-set signal provided from the OR circuit 23 is supplied to a counter 28 which delays that signal for a period of time (e.g., between 80 msec and 100 msec) corresponding to the delay time of the low pass filter 12, and this delayed signal is supplied through an OR circuit 29 to the AND gates 26 and 27. Therefore, after a predetermined time corresponding to the delay time of the filter 12 after the AFT voltage is obtained, a respective one of the signals AFT UP and AFT DN appear at the output terminals of the AND gates 26 and 27. The output signals from these AND gates 26 and 27 are respectively applied through OR circuits 30 and 31 to a set terminal S and a reset terminal R of a flip-flop circuit 32. The uninverted output Q and the inverted output $\overline{Q}$ of this flip flop 32 are respectively coupled to terminals UP and DN of the pulse generator 11 to respectively increase and decrease the width of the pulses generated thereby, and, correspondingly, to increase and decrease the local oscillator frequency.

The signals AFT UP and AFT DN are also applied through inverters 34 and 35 to an AND gate 35. The output of this AND gate 35 is furnished to respective inputs of further AND gates 36 and 37. Furthermore, the detecting signal $S_y$, derived from the synch signal detector 7, is applied to an input terminal 38. This signal $S_y$ is high when the synchronizing signal $S_h$ is detected, but is low otherwise. The signal $S_y$ is supplied to another input terminal of the AND gate 36, and is also supplied to an inverter 39. The latter provides an inverted detecting signal $\overline{S_y}$ to another input terminal of the AND gate 37. Thus, the output from the AND gate 36 is high only when the AFT signal is absent (i.e., the AFT voltage is at the reference level) and the signal $S_y$ is high. Similarly, the output from the AND gate 37 is high when the AFT signal is absent and the detecting signal $S_y$ is low. The outputs from these AND gates 36 and 37 are respectively applied to inputs of the OR gates 30 and 31. The outputs Q and $\overline{Q}$ of the flip-flop circuit 32 are also supplied to AND gates 40 and 41, respectively, and the signals AFT UP and AFT DN are also supplied through respective inverters 42 and 43 to these AND gates 40 and 41. The outputs of these AND gates 40 and 41 are coupled to set terminals S of flip-flop circuits 44 and 45, respectively. The uninverted outputs Q of these flip-flop circuits 44 and 45 are connected to respective inputs of AND gates 46 and 47. The signals AFT DN and AFT UP are also applied from the input terminals 25 and 24 to respective inputs of the AND gates 46 and 47. The outputs of these AND gates 46 and 47 are connected through an OR circuit 48 to a set terminal S of another flip-flop circuit 49. The inverted output Q of this flip-flop circuit 49 is supplied to an input terminal of each of the AND gates 40 and 41. The output of the OR circuit 23 is coupled through another OR circuit 50 to a reset terminal R of this flip-flop circuit 49. The uninverted output terminal Q of this flip-flop circuit 49 provides a zero-cross signal $S_p$ to indicate that the AFT voltage has changed from below to above the reference level, or from above that level to below it. The signals provided at the outputs of the AND gates 40 and 41 are high only when the respective signals AFT UP or AFT DN vanish, and these resulting signals are then stored in the flip-flop circuits 44 and 45. The outputs from the AND gates 46 and 47 are high when the AFT voltage has changed level and crossed over the reference level. Thus, the flip-flop circuit 49 is set only when the AFT voltage reaches the zero-cross point corresponding to the frequency $f_p$ of FIG. 4B.

The zero-cross signal $S_p$ is then supplied to the pulse generator 11 to set the same into a low-speed mode in which the rate of change of pulse width is slower by a factor of 64 than when the signal $S_p$ is absent.

The output of the OR circuit 48 is also supplied to a pair of AND gates 51 and 52 whose other inputs are respectively connected to the uninverted and inverted output terminals Q and $\overline{Q}$ of the flip-flop circuit 32. The outputs of these AND gates 50 and 51 are respectively connected to inputs of the OR circuits 30 and 31. Thus, the levels appearing at the outputs of these AND gates 51 and 52 correspond to the levels of the outputs Q and $\overline{Q}$ of the flip-flop circuit 32 at the time just before the AFT signal reaches the zero-cross point. Thus, the output levels from these AND gates 51 and 52 are applied to the flip-flop circuit 32 to change the state thereof when the zero-cross point is reached.

The outputs of the OR circuits 30 and 31 are also applied through another OR circuit 53 to a set terminal S of a flip-flop circuit 54 and to a counter 55 providing a delay of a predetermined amount (e.g., 150 msec) thereto. The output of the OR circuit 48 is provided to a reset terminal R of this flip-flop circuit 54. The outputs of this flip-flop circuit 54 and of the counter 55 are connected to inputs of an AND gate 56, and the latter provides an output signal * whenever the zero-cross point of the AFT signal is not detected during the predetermined time defined by the counter 55 after the AFT operation is commenced. The output signal * of this AND gate 56 is then applied to an input of the OR circuit 23 and the AFT operation is restarted.

The outputs of the AND gates 40 and 41 are applied through another OR circuit 57 to a set terminal S of a flip-flop circuit 58 and to a counter 59 which imparts to that signal a delay of a predetermined amount (e.g., 100 msec). The output of the OR circuit 48 is also applied to a reset terminal R of the flip-flop circuit 58. The outputs of the flip-flop circuit 58 and the counter 59 are applied to an AND gate 60. Accordingly, the latter provides an output signal  whenever the zero-cross point of the AFT signal is not detected for a predetermined time after the AFT signal vanishes. This output signal  is provided to the OR circuit 23 to restart the AFT operation.

The zero-cross signal $S_p$ is also furnished from the flip-flop circuit 49 to a counter 61 for delaying that signal for a predetermined time (e.g., 150 msec). The output of this counter 61 is coupled to an input of an AND gate 62 and the input terminal 38 is coupled through an inverter 63 to another input of the AND gate 62. The output of this AND gate 62 is coupled to a set terminal S of a flip-flop circuit 64 and the output Q of the flip-flop circuit 64 is coupled to an input of another AND gate 65. The detecting signal $S_y$ is also provided to another input of this AND gate 65, and the output of the latter is applied to a reset terminal R of the flip-flop circuit 64. This AND gate 62 provides an output signal whenever the zero-cross point of the AFT signal is detected while the detecting signal $S_y$ is at low level. This output signal is then stored in the flip-flop circuit 64. The AND gate 65 provides an output signal * to indicate that the detecting signal $S_y$ has changed to high level after a time that the zero-cross point has been reached and the signal $S_y$ was at low level. This output signal * is supplied through the OR circuit 29 to the AND gates 26, 27, and 35 and thereby causes AFT operation to commence on the basis of the detection of the synchronizing signal $S_h$. The output signal * is also applied through the OR circuit 50 to reset the flip-flop circuit 49**.

The detecting signal $S_y$ is also applied from the input terminals 38 to an input of an AND gate 66 which has another input connected to the counter 61. This AND gate 66 provides at an output terminal 67 an output signal indicating that the AFT signal has reached the zero-cross point and that the synchronizing signal $S_h$ is present.

An embodiment of the synch signal detecting circuit 7 suitable for use with this invention is shown in detail in FIG. 7.

In this synch signal detecting circuit 7, synchronizing signals $S_h$ are applied to an input terminal 71 which is connected to a clock terminal CK of a counter 72.

A 1 $\mu$sec clock pulse signal is applied to clock terminals CK of a counter 74 and a shift register 75. A carry signal is provided from the counter 74 whenever the same counts one thousand clock pulses. This carry signal is provided to a data input terminal D of the shift register 75 and an output $Q_2$ of this register 75 is coupled through an OR circuit 76 to a clear terminal CL of the counter 72.

Outputs corresponding to the counts of "15", "16", and "17" of the counter 72 are connected through an OR circuit 77 to one input of an AND gate 78. A $Q_1$ output of the shift register 75 is coupled to another input of the AND gate 78, and the output of this AND gate 78 is applied to a clock input CK of another counter 79.

The carry signal from the counter 74 is also applied to a clock input CK of a counter 80 which provides a carry signal each time the counter 80 attains a count of "5". This carry signal is applied to a data input terminal D of a shift register 81 and the 1 $\mu$sec clock signal is applied from the input terminal 73 to a clock input CK of the shift register 81.

A $Q_3$ output of this shift register is applied through an OR circuit 82 to a clear input terminal CL of the counter 80. A $Q_2$ output of the register 81 is applied through an OR circuit 83 to a clear input terminal CL of the counter 79.

An OR circuit 84 has inputs coupled to outputs of the counter 79 corresponding to respective counts of "4" and "5", and has an output coupled to one input of an AND gate 85. Another input of this AND gate 85 is coupled to a $Q_1$ output of the shift register 81, and the output of the AND gate 85 is coupled to a set input terminal S of a flip-flop circuit 86. The output of the OR circuit 84 is also supplied through an inverter 87 to an input of another AND gate 88 which is also coupled to the $Q_1$ output of the shift register 81. An output of this AND gate 88 is supplied through an OR circuit 89 to a reset input terminal R of the flip-flop circuit 86. A non-inverted output Q of this flip-flop circuit 86 provides the detecting signal $S_y$ to an output terminal 90. It is this detecting signal $S_y$ which is then provided to the terminal 38 in the circuit illustrated in FIG. 6.

A reset input terminal 91 receives an external reset signal. This reset signal is then provided from the terminal 91 through the OR circuits 76, 82, 83 to the clear terminals CL of the counters 72, 80, and 83 and to the reset terminal R of the flip-flop 86.

In this detecting circuit, a pulse signal with a period of 1 msec is formed as the carry signal from the counter 74, and another pulse signal having a period of 5 msec is provided as the carry signal from the counter 80.

The counter 72 counts the number of occurrences of the horizontal synchronizing pulses during each period of 1 msec. Because the normal horizontal frequency is 15.75 KHz, 15.75 such horizontal pulses can be expected to occur, on the average, during each 1 msec period. If a variation of 2.5 percent is to be accommodated, corresponding to a range of 15.35 to 16.14 pulses for each one 1 msec period, a normal number of horizontal synchronizing pulses can be considered to have occurred by the counter 72 if a count of "15", "16", or "17" is attained. Thus, if any of the outputs corresponding to a count of "15", "16", or "17" are high at the end of any one 1 msec period, the AND gate 78 will provide a counting signal to the counter 79.

The carry pulse from the counter 74 is delayed by 1 $\mu$sec by action of the shift registers 75, and this delayed pulse is applied to the clear terminal CL of the counter 72. However, an undelayed pulse is provided to the AND gate 78. Thus, the output of the AND gate 78 corresponds to a count of "15", "16", or "17" at a time just before the counter 72 is cleared. If the output of the AND gate 78 is high, the counter 79 is incremented by 1.

The carry signal from the counter 80 occurs every 5 msec, and this carry signal, delayed by 1 $\mu$sec, is used to clear the counter 79. Thus, the counter 79 counts the number of times in each 5 msec period that the output of the AND gate 78 has been high. Here, it is considered normal if the output of the AND gate 78 is high at least eighty percent of the time. Therefore, the OR circuit 84 is connected to the counter 79 to provide a high signal whenever the counted contents of the counter 79 are "4" or "5".

The carry signal from the counter 80 is provided at the $Q_1$ output of the register 81 to the AND gates 85 and 88. Thus, the flip-flop circuit 86 is set whenever a normal number of horizontal synchronizing pulses are detected for each 5 msec period but is reset whenever the normal number of synchronizing pulses $S_h$ are not detected.

The $Q_3$ output of the shift register 81 clears the counter 80 2 $\mu$sec following the end of each such 5 msec period.

Thus, the detecting signal $S_y$ provided at the output terminal 90 is high to indicate the presence of a normal number of pulses of horizontal synchronizing signal $S_h$ and is low otherwise, to indicate the absence of such signal.

Figure 8:
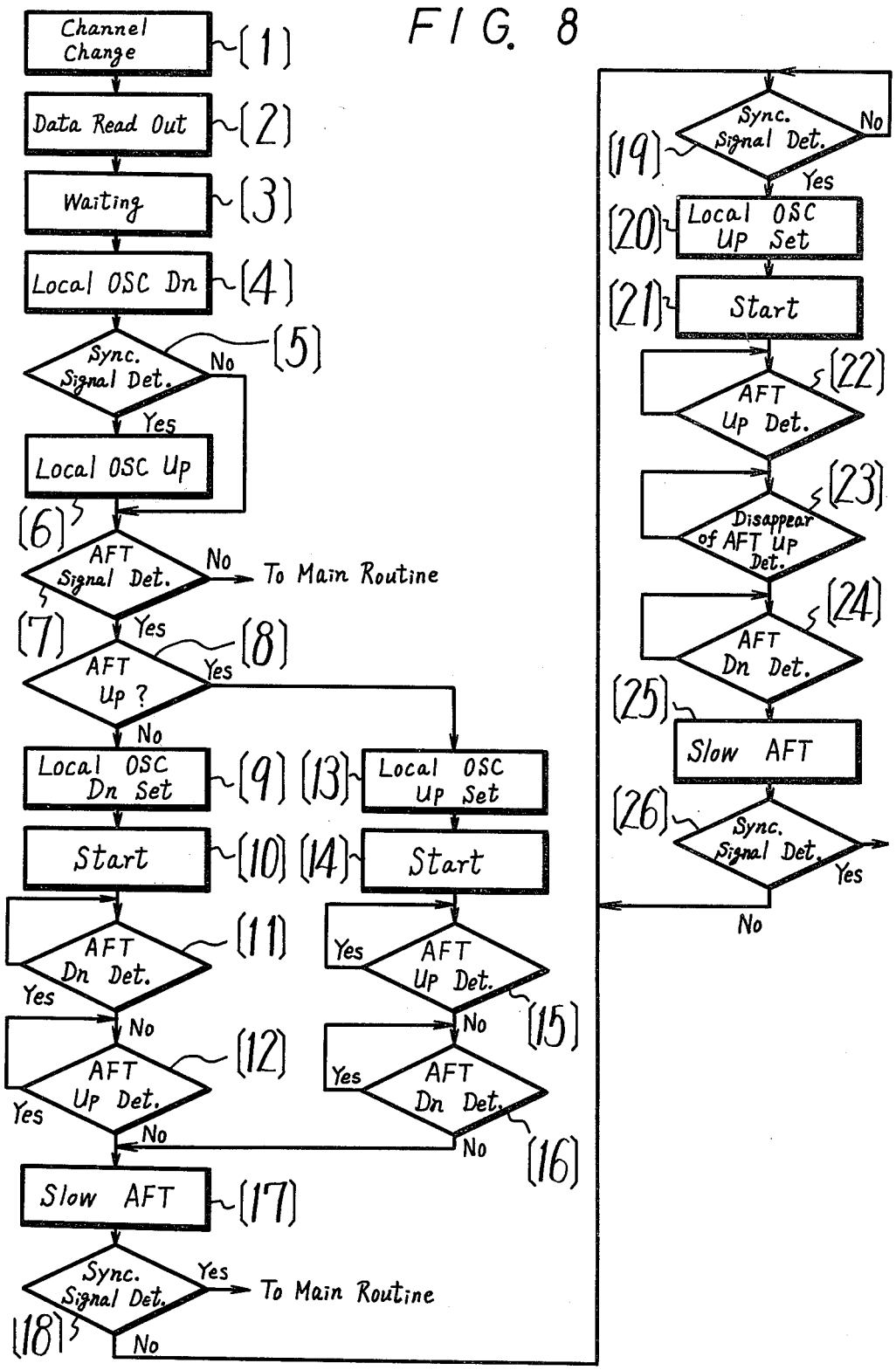
FIG. 8 is flow chart for explaining the operation of an alternative embodiment of this invention.

While the block diagram of FIG. 4 illustrates one embodiment of an AFT circuit of this invention, it should be understood that the present invention can also be practiced by using an AFT circuit incorporating a microcomputer with an appropriate operating program. FIG. 8 shows a flow chart of such an operating program.

In FIG. 8, step [1] indicates that a channel change operation is to be commenced, for example, in response to a viewer command entered on a push button control panel.

In step [2], channel selection data, corresponding to a channel selection voltage to be applied to the local oscillator, is read out from memory.

In step [3], a delay, or waiting time corresponding to the delay imparted by the low-pass filter 12 is permitted to pass.

Next, in step [4], the local oscillator frequency is decreased.

In step [5], the existence of the horizontal synchronizing signal $S_h$ is detected. If the horizontal synchronizing signal is present, the program proceeds to step [6]; otherwise, it proceeds to step [7].

In step [6], the local oscillator frequency is increased. Then, in step [7] if the AFT signal is detected to be present, i.e., to be above or below the predetermined level, the program proceeds to step [8], and if the AFT signal is below the reference level, the program proceeds to step [9], but if it is above that level, it proceeds to step [13]. In step [7], if the AFT signal is not present, the program proceeds to a main routine, i.e., the microcomputer is released to perform other functions.

In step [9], the AFT procedure for lowering the local oscillator signal is set into the microcomputer, and in step [10] the operation is started. In step [11], it is detected whether the AFT signal is low, i.e., below the predetermined reference level, and in step [12], it is determined whether the AFT signal is now high, i.e., above the reference level. If, at step [8], the AFT signal is above the predetermined reference level, then in step [13] the routine for raising the local oscillator frequency is set in the microcomputer, and in step [14] this routine is started. Then, in step [15], it is detected whether the AFT signal is low, i.e., above the reference level, and in step [16] it is detected whether the AFT signal is below that level.

After either step [12] or [16] has indicated that the AFT signal has returned to the predetermined reference level, a slow AFT operation is started in step [17] and the local oscillator frequency is changed at a slow rate to fine-tune the receiver.

In step [18], if horizontal synchronizing signals are detected to be present, the receiver is considered to be tuned to the picture carrier $f_p$ and the microcomputer is released to perform other functions. However, if synchronizing signals are not detected, the program proceeds to step [19]. Here, the AFT operation is restarted, and when synchronizing signals are detected in step [19], the routine proceeds to steps [20] and [21], in which the operation for raising the local oscillator frequency is set and started, respectively. In step [22] it is determined whether the AFT signal is above the predetermined reference level, and once the AFT signal is detected to be above that level, when the AFT signal is detected in step [23] to have dropped down to the predetermined level, the program proceeds to step [24] in which it is detected whether the AFT signal is below the predetermined level. When the AFT voltage has passed from above to below the predetermined AFT reference level, the program proceeds to step [25] in which fine tuning is carried out at a slow rate. Then, in step [26], if synchronizing signals are detected to be present, the microcomputer is released to perform other functions. However, if no synchronizing signals are detected to be present, the operation program returns to step [19], and the operation steps [19] through [26] are repeated.

In the program represented in the flow chart of FIG. 8, the fact that the AFT signal is above or below the predetermined reference level of the AFT discriminator 5 can be represented by the signals AFT UP and AFT DN that are used in the embodiment of FIG. 6. Also, the AFT discriminator 5 can be arranged to provide the signals AFT UP and AFT DN directly whenever the local oscillator frequency is too low or too high, respectively.

Although particular embodiments of this invention have been shown hereinabove, it should be understood that the invention is not limited to those precise embodiments, and that many modifications and variations thereof will be apparent to those skilled in the art without departure from the scope or spirit of this invention, as defined in the appended claims.

What is claimed is:

1. Automatic fine tuning circuit for controlling a heterodyne tuning stage of a television receiver in which a local oscillator generates a local oscillator signal at a tunable local oscillator frequency to be mixed with a broadcast-frequency video signal to which the receiver is to be tuned to produce a video IF signal constituted by a video information signal carried on a video IF carrier having a video IF frequency, comprising:

frequency discriminator means having an input receiving said video IF signal and an output providing an AFT signal representing any departure of the video IF frequency from a predetermined frequency and which is present only when said video IF frequency is within an AFT capture range defined by predetermined frequency limits;

detecting means for detecting the existence of a synchronizing signal occurring in said video information signal and providing a detecting signal indicative of the presence of such synchronizing signal; and control means for selectively generating control signals supplied to said local oscillator in response to said AFT signal and said detecting signal; said control means generating a first control signal to control the local oscillator frequency in accordance with said AFT signal whenever said AFT signal is present, said control means generating a second control signal operative to increase the local oscillator frequency when said AFT signal is not present and said detecting signal is detected to be present and said control means generating a third control signal operative to decrease the local oscillator frequency when said AFT signal is not present and said detecting signal is not present.

2. Automatic fine tuning circuit according to claim 1, wherein said control means for selectively generating said control signals includes direction detector means having inputs to receive said AFT signal and said detecting signal and providing a direction signal of one sense corresponding to an increase of said local oscillator frequency when said AFT signal is above a reference level and providing a direction signal of an opposite sense when said AFT signal is below said reference level, and when said AFT signal is at said reference level, providing said direction signal of said one sense when said synchronizing signal is detected to be present, and providing said direction signal of said opposite sense when said synchronizing signal is not detected to be present.

3. Automatic fine tuning circuit according to claim 2, wherein said control means further includes zero-cross detector means having inputs coupled to receive said AFT signal and said direction signal and providing a zero-cross signal when said AFT signal is detected to change from above to below said reference level or from below to above said reference level.

4. Automatic fine tuning circuit according to claim 3, wherein said control means further comprises discriminating circuit means having inputs coupled to receive said zero-cross signal and said detecting signal and provides a discriminating signal in response to occurrence of said zero-cross signal when said synchronizing signal is detected to be present.

5. Automatic fine tuning circuit according to claim 4, wherein said control means further includes output control circuit means having inputs coupled to receive said direction signal and said discriminating signal and an output providing an error signal to said local oscillator to raise the local oscillator frequency when said synchronizing signal is not detected to be present, to lower the local oscillator frequency when said synchronizing signal is detected to be present but said AFT signal indicates that said video IF signal is outside said capture range, and to change the local oscillator frequency in accordance with said AFT signal when said synchronizing signal is present and said AFT signal indicates that said video IF signal is within said capture range.

6. Automatic fine tuning circuit according to claim 1, wherein said AFT signal is above a reference level when said video IF signal is below said predetermined frequency and within said capture range, and is below said reference level when said video IF signal is above said predetermined frequency and within said capture range, and said control means includes logic means having outputs respectively providing AFT set and AFT reset signals when said AFT signal is respectively above and below said reference level, and a bistable circuit having set and reset inputs respectively coupled to receive said AFT set and reset signals and complementary outputs providing respective control signals for raising and lowering said local oscillator frequency in accordance with the state of said bistable circuit.

7. Automatic fine tuning circuit according to claim 6, further comprising means coupled to said set and reset inputs of said bistable circuit for changing the state of the latter in accordance with a change of said AFT signal from above or below said reference level to such level.

8. Automatic fine tuning circuit according to claim 7, wherein said means for changing the state of said bistable circuit includes first and second flip-flop each having a set input, a reset input, and an output; first and second logic circuits coupled to receive said AFT set and reset signals, respectively, and also coupled to receive said respective control signals, and having outputs coupled to the set terminals of the respective first and second flip-flops; a pair of logic AND gates each having an input coupled to the output of a respective one of the first and second flip-flops, another input coupled to receive a respective one of said AFT set and reset signals, and an output, and a logic OR circuit having inputs coupled to the outputs of said pair of logic AND gates and having an output; and a second pair of logic AND gates having first inputs coupled to the output of said logic OR circuit, second inputs respectively coupled to the outputs of said bistable circuit, and outputs respectively coupled to the set and reset inputs of the latter.

9. Automatic fine tuning circuit according to claim 6, wherein said control means further includes means providing an absence signal when both said AFT set and AFT reset signal are absent; a pair of logic AND gates each having an input coupled to receive said absence signal, a second input, and an output coupled to a respective one of the set and reset inputs of said bistable circuit, the second input of one of said logic AND gates being coupled to receive said detecting signal; and an inverter having an input coupled to receive said detecting signal and an output coupled to the second input of the other of said logic AND gates.

10. Automatic fine tuning circuit according to claim 6, wherein said control means includes zero-cross detecting means including a flip flop circuit having a set input, a reset input, and an output providing a zero-cross signal; logic means coupled to said set input providing a set signal thereto when said AFT signal changes from above said reference value to below the same, and from below said reference value to above the same; and means coupled to said reset input to reset said flip flop circuit when any one or more of the following conditions occurs: said AFT signal remains at said reference level for more than a predetermined period; said synchronizing signal is detected to be present after said zero-cross signal has been produced at a time when said synchronizing signal has not been detected to be present; and said zero-cross signal is not produced within a predetermined length of time.

11. Automatic fine tuning circuit according to claim 1, wherein said detecting means includes a counter having a clock input coupled to receive said synchronizing signal, means for resetting said counter at periodic intervals, and gate means coupled to a plurality of inputs of said counter to provide an output of one sense if a number occurrences of said synchronizing signal counted thereby are within a predetermined counting range, and of another, complementary sense otherwise.

12. Automatic fine tuning circuit according to claim 11, wherein said detecting means further includes a second counter having a clock input coupled to the output of said gate means; means for resetting said second counter at intervals corresponding to a predetermined plurality of said periodic intervals; and logic means coupled to a plurality of outputs of said second counter to provide an output signal of one sense when the output of said gate means has said one sense for at least a given fraction of said predetermined plurality of periodic intervals.

13. Automatic fine tuning circuit according to claim 1, wherein said control means includes means for automatically initiating an increase in said local oscillator frequency if said synchronizing signal is detected to be absent when said control means has completed tuning on the basis of said AFT signal, so that the tuning stage is prevented from locking to the frequency of a sound carrier in a lower channel adjacent the channel of said broadcast-frequency video signal.

14. Automatic fine tuning circuit according to claim 13, wherein said control means includes a low pass filter for passing said control signal as a DC signal to said local oscillator and having an inherent time delay, and said means for automatically initiating an increase in said local oscillator frequency includes delay means for delaying the automatic initiation of said increase for a time corresponding to said inherent time delay.

15. Automatic fine tuning circuit according to claim 1, wherein said control circuit means includes means providing a restart signal if said AFT signal returns from above or below said predetermined reference level to the latter but does not cross over said reference level to a voltage therebelow or thereabove, respectively, within a predetermined period of time, and means for automatically initiating, in response to said restart signal, an increase or decrease in said local oscillator frequency on the basis of the detected presence or absence, respectively, of said synchronizing signal.

16. A method of automatically adjusting the tuning of a heterodyne tuning stage of a television receiver in which a local oscillator generates a local oscillator signal at a tunable local oscillator frequency to be mixed with a broadcast-frequency video signal to which the receiver is to be tuned to produce a video IF signal constituted by a video information signal carried on a video IF carrier having a video IF frequency; comprising:
    providing an AFT signal representing any departure of the video IF frequency from a desired frequency and which is present only when said video IF signal is within an AFT capture range defined by predetermined frequency limits;
    detecting the existence of a synchronizing signal occurring in said video information signal to provide a detecting signal indicative of the presence of such synchronizing signal; and
    generating a control signal to be supplied to said local oscillator in response to said AFT signal and in response to said detecting signal; said control signal being generated to control the local oscillator frequency in response to said AFT signal when said AFT signal has a value indicating that such video IF signal is within said capture range but, when said AFT signal is not present said control signal being provided in response to said detecting signal such that when said synchronizing signal is detected to be present in said video information signal carried on said video IF signal, said control signal is operative to increase the local oscillator frequency but, when said synchronizing signal is not detected to be present and said AFT signal is not present, said control signal is operative to decrease the local oscillator frequency.

17. A method of automatically adjusting tuning according to claim 16 wherein said step of generating a control signal includes, after said local oscillator has been tuned to a desired channel frequency, waiting for a predetermined delay time; reducing the local oscillator frequency if said synchronizing signal is not detected to be present but increasing the local oscillator frequency if said synchronzing signal is detected to be present; if said AFT signal is present and indicates that said video IF signal is below said predetermined frequency, increasing said local oscillator frequency, but if said AFT signal is present and indicates that said video IF signal is above said predetermined frequency, decreasing said local oscillator frequency; if said synchronizing signals are not detected at the time that said AFT signal indicates that the video IF signal is at said desired frequency, raising the local oscillator frequency until said AFT signal indicates that said video IF signal is within said capture range; and finely adjusting the local oscillator frequency in response to said AFT signal.

* * * * *